United States Patent [19]

Yoshimori et al.

[11] Patent Number: 5,444,393
[45] Date of Patent: Aug. 22, 1995

[54] SEMICONDUCTOR INTEGRATED CIRCUIT FOR SELECTIVELY PERFORMING A REWIRING OR A LOGICAL OPERATION

[75] Inventors: Takashi Yoshimori; Toshiaki Mori, both of Yokohama, Japan

[73] Assignee: Kabushiki Kaisha Toshiba, Kawasaki, Japan

[21] Appl. No.: 992,762

[22] Filed: Dec. 18, 1992

[30] Foreign Application Priority Data

Dec. 19, 1991 [JP] Japan ................. 3-337089
Nov. 12, 1992 [JP] Japan ................. 4-302517

[51] Int. Cl.⁶ ......................................... H03K 19/173
[52] U.S. Cl. ........................................ 326/38; 326/39; 326/46
[58] Field of Search ................. 307/465–469

[56] References Cited

U.S. PATENT DOCUMENTS

| | | | |
|---|---|---|---|
| 4,783,606 | 11/1990 | Goetting | 307/465 |
| 4,940,909 | 7/1990 | Mulder | 307/465 |
| 5,132,570 | 7/1992 | Shutou | 307/465 |
| 5,144,166 | 9/1992 | Camarota | 307/465 |
| 5,204,556 | 4/1993 | Shankar | 307/465 |
| 5,245,227 | 9/1993 | Furtek | 307/465 |

Primary Examiner—David R. Hudspeth
Assistant Examiner—Andrew Sanders
Attorney, Agent, or Firm—Foley & Lardner

[57] ABSTRACT

A device includes an electrically programmable semiconductor integrated circuit or circuits, such as a Field Programmable Gate Array. Each circuit comprises a plurality of fundamental sections connected to a plurality of signal lines, wherein each fundamental section is permitted to carry out both operation in a logical operation mode for performing a logical operation using signals delivered from the signal lines and operation in a wiring formation mode for carrying out setting of connecting states between the respective signal lines, whereby the semiconductor integrated circuit is operable in any operation mode arbitrarily selected. The fundamental section may be of a structure capable of performing a sequential logical operation as the logical operation mode. In this case, at least one of the memories of the memory section corresponds to a latch memory.

2 Claims, 15 Drawing Sheets

SEMICONDUCTOR INTEGRATED CIRCUIT FOR SELECTIVELY PERFORMING A REWIRING OR A LOGICAL OPERATION

BACKGROUND OF THE INVENTION

This invention relates to a semiconductor integrated circuit, and more particularly to an electrically logic programmable circuit.

Electrically programmable devices of a relatively large scale are generally called Field Programmable Gate Arrays (hereinafter abbreviated as a FPGA). FPGA can be independently programmed at logic circuits for carrying out logical operations and at wiring formation sections for switching connecting states between signal lines. In a conventional FPGA, as shown in FIG. 16, a region 50 where logic circuits are formed and regions 51-54 where wiring formation sections are formed are physically separated. Also, in a FPGA shown in FIG. 17, a region 60 where logic circuits are formed and regions 61-64 where wiring formation sections are formed are separated. In FIG. 17, reference symbols IOB 65-70 represent regions where blocks for input/output circuits are provided, respectively.

The outline of the configuration of such a conventional FPGA is shown in FIG. 18, and the principle of the operation thereof will be described below. As described above, the FPGA is divided into three fundamental or basic components (elements) of a block (CLB) 81 where logic circuits are formed, a wiring formation section 82, and an input/output circuit block (IOB) 83. The logic circuit block 81 is a block in which basic logical elements are combined to perform logical operations, and includes a combination logic section 81a and flip-flop sections 81b, 81c as shown in FIG. 19. The wiring formation section 82 serves to connect respective logic circuit blocks 81 to each other and is adapted so that switching of connections can be freely made by programming. In addition, the input/output circuit block 83 is a section where circuits for interfacing between the device and external are formed. Similarly, programming can be made therein.

These three fundamental elements are such that alterations of functions can be respectively made by programming so that a desired specification can be set. Setting of the specification can be desirably changed by rewriting the contents of program memories corresponding to respective fundamental elements, with a relationship of one-to-one correspondence.

However, the conventional FPGAs mentioned above have the following problems. Although it is necessary that the ratio between respective areas of the logic circuit blocks 81 and the wiring formation sections 82 be set to an optimum value in order to realize miniaturization of the device, such a ratio varies to a large degree, in dependency upon the specification of the entire logic functions.

Even with an FPGA using the same logic circuit elements 91-94 as shown in FIGS. 20(a) and (b), a required quantity of wirings varies to a large degree, in dependency upon the entire logic circuit functions.

However, in conventional FPGAs, there is no compatibility between the logic circuit block and the wiring formation section, and setting of the area ratio is uniformly determined. For this reason, in dependency upon the specification of the device, there are instances where the area utilization efficiency is remarkably low. Such problems have become increasingly conspicuous with improvements in the degree of integration. In addition, in attempting to carry out extension or expansion of the scale of the device corresponding to the progress of the semiconductor miniaturization technology, because the logic sections and the wiring sections are separately formed, there are difficulties in expanding or extending.

SUMMARY OF THE INVENTION

Accordingly, an object of this invention is to provide a semiconductor integrated circuit such that the ratio between the area occupied by the region where logic circuits are formed, and the area of the section where wirings are formed is set to an optimum value to thereby improve the utilization efficiency of the area, thus making it possible to make a contribution to miniaturization of the device. Another object of this invention is to provide a basic structure of the above-mentioned semiconductor integrated circuit which can easily cope with expansion of the scale.

In accordance with this invention, there is provided a semiconductor integrated circuit comprising a plurality of fundamental sections connected to a plurality of signal lines, in which these fundamental sections can carry out both operations in a logical operation mode for performing logical operations by using signals delivered from the signal lines, and the operation in a wiring formation mode for carrying out settings of connecting states between the respective signal lines, whereby the fundamental section is operable in any operation mode arbitrarily selected.

Since the semiconductor integrated circuit of this invention comprises a plurality of fundamental sections which can realize both operations in the logic operation mode and the wiring formation mode, the fundamental sections are operated in either operation mode arbitrarily selected in dependency upon the specification of the device, thus permitting the area ratio to be an optimum value.

In this invention, the above-mentioned fundamental section may comprise mode designation means adapted for outputting a mode signal for designating either of the logical operation mode and the wiring formation mode; a memory section including a plurality of memories for storing data; a decoder adapted to be brought into an operative state when the mode signal output from the mode designation means corresponds to the logical operation mode to decode a logical input signal given thereto to thus output a switching signal; a first switching circuit including a plurality of first switching elements connected to the memories that the memory section has, and being responsive to the switching signal given thereto, to switch ON/OFF states of the first switching elements to thus allow the memory or memories connected to the first switching element or elements which have turned ON the first switching elements, to output data stored therein as a logical output signal; a second switching circuit including a plurality of second switching elements connected to the memories that the memory section has, and being operative to allow the second switching elements to be turned ON when the mode signal output from the mode designation means corresponds to the wiring formation mode, to thus allow the memory or memories connected to the second switching element or elements which have been turned ON to output data stored therein as a wiring formation signal; and a third switching circuit including a plurality of third switching elements connected between the signal lines, and being responsive to the wiring formation signal output from the second switching circuit, to thus switch ON/OFF states of the third switching elements.

In the case where the fundamental section includes the mode designation means, the memory section, the decoder, and first, second and third switching circuits as stated above, any mode is designated by a mode signal output from the mode designation means. In the case where the logical operation mode is designated, the decoder is brought into an operative state and decodes a logical input signal given thereto to output a switching signal. When this switching signal is given to the first switching circuit, the ON/OFF states of the first switching elements are switched. As a result, data stored in a memory or memories which have been brought into the ON state are output as a logical output signal. On the other hand, in the case where the wiring formation mode is designated, second switching elements that the second switching circuit has are turned ON. As a result, data stored in a memory or memories connected to the second switching elements which have been turned ON are output as a wiring formation signal. When this wiring formation signal is given to the third switching circuit, the ON/OFF states of the third switching elements are switched. As a result, connecting states between signal lines connected to the fundamental or basic section are set. As stated above, operation in any mode can be made, and it is possible to arbitrarily select a desired mode.

Alternatively, the fundamental section may carry out a sequential logical operation as the logical operation mode. In this case, at least any one of the memories that the memory section has will correspond to a memory for latch. As the above-mentioned decoder, there may be employed a decoder such that when an inputted logic input signal is at a predetermined level, the decoder allows a first switching element connected to the memory for latch of the first switching elements to be turned ON to deliver data given from the signal line to the memory for latch to cause that memory to latch it.

In the case where at least any one of memories that the memory section has is a memory for latch as stated above, when the logical input signal is at a predetermined level, a first switching element connected to the memory for latch is caused to be turned ON by the decoder so that data given from the signal lines are latched in the memory for latch. Sequential logic operation is therefore realized.

DESCRIPTION OF THE PREFERRED EMBODIMENTS

Preferred embodiments of this invention will now be described with reference to the attached drawings. A semiconductor integrated circuit according to an embodiment is of a basic structure comprising fundamental sections arranged in an array form, each fundamental section having the two functions of a section where wirings can be formed and a section where logical operations can be performed.

Figure 2:
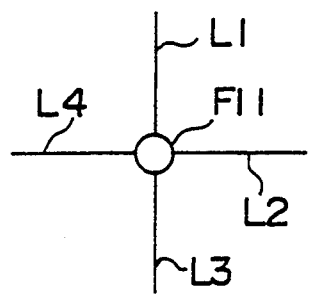
FIG. 2 is an explanatory view schematically showing an example of the configuration of the fundamental section of this invention.

To the fundamental section, a plurality of signal lines are connected. For example, to the fundamental section F11 shown in FIG. 2, four signal lines L1–L4 are connected. This fundamental section F11 realizes two basic operation modes of a logical operation mode for performing any logical operation between four signal lines L1–L4 and a wiring formation mode for setting any connecting state between the four signal lines L1–L4.

Figure 3:
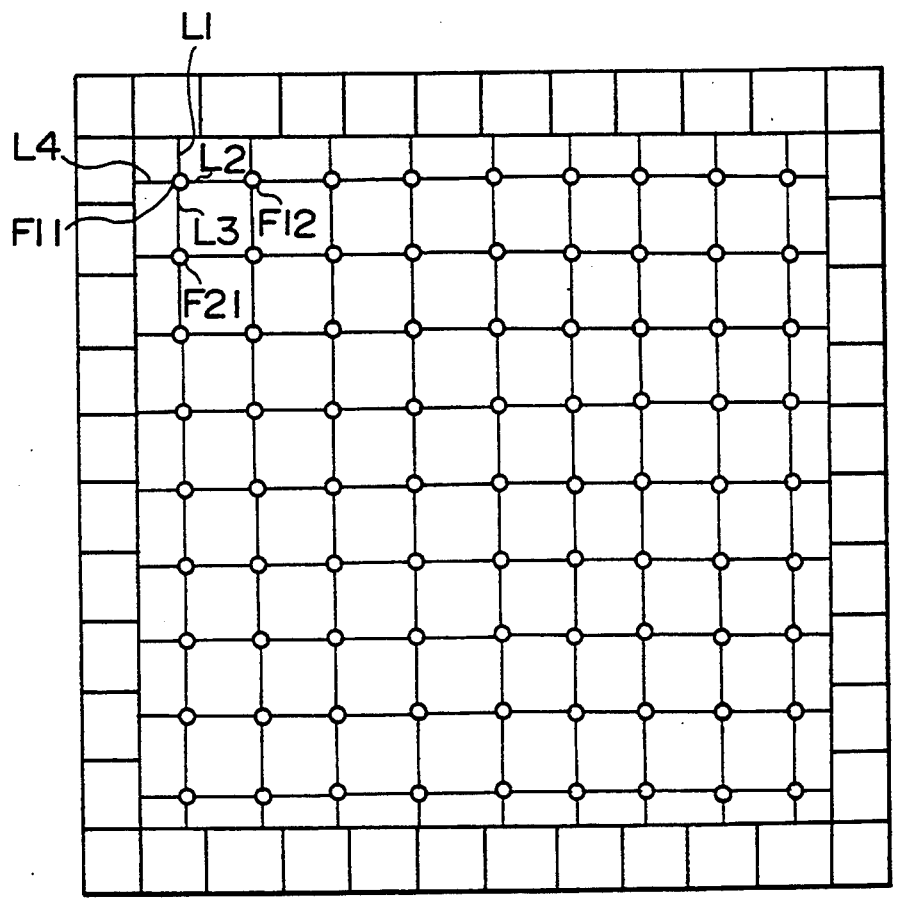
FIG. 3 is an explanatory view showing the configuration in which a plurality of fundamental sections mentioned above are combined.

As shown in FIG. 3, a plurality of fundamental sections F11, F12, F21, — are arranged in an array form, and respective fundamental sections are connected by means of signal lines L1, L2, L3, L4, —.

As stated above, the semiconductor integrated circuit in this embodiment is of a structure comprising fundamental sections cyclically arranged. In other words, this semiconductor integrated circuit has a uniform configuration as a whole except for input/output circuits for inputting and outputting to and from external. Accordingly, in all regions except for the input/output circuits, it is possible to freely select either of the logical operation mode and the wiring formation mode to set the selected one. As a result, it is possible to optimumly set the ratio between the region where the logical operations are performed and the region where wiring formation is carried out in correspondence with the specification of the device. Thus, the area utilization efficiency can be improved to a large degree when compared to conventional devices in which respective regions are fixed in advance.

Figure 1:
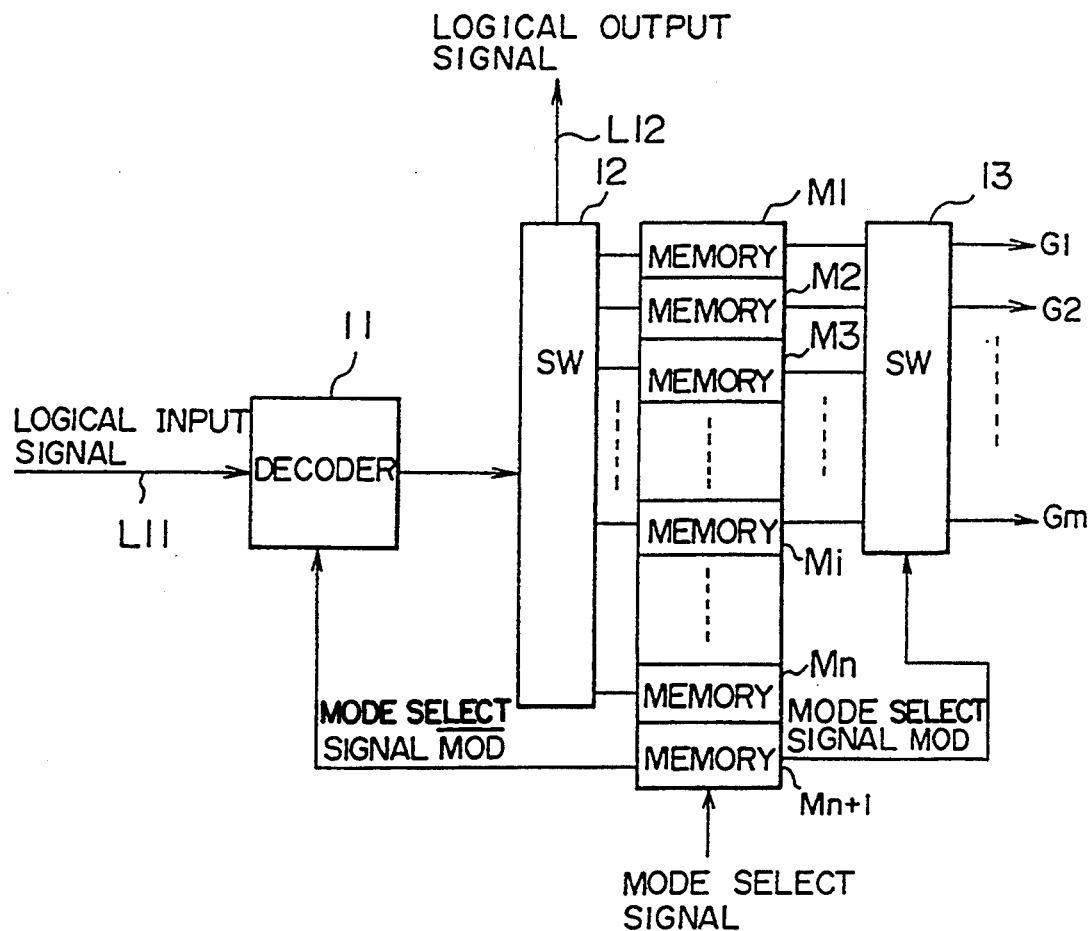
FIGS. 1(A) and 1(B) are circuit diagrams showing the configuration of one fundamental section of a semiconductor integrated circuit according to a first embodiment of this invention.
Figure 1:
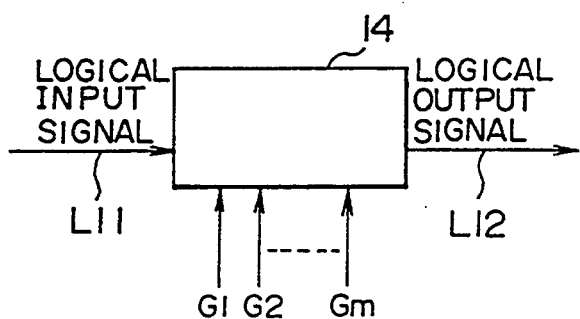

The configuration in a more practical sense is shown in FIGS. 1(a) and (b) as a first embodiment of this invention. As shown in FIG. 1(a), this embodiment includes a decoder 11, switching circuits 12 and 13, and memories M1–Mn+1. To two input terminals of the decoder 11, a logical input signal and a mode select signal bar MOD outputted from the memory Mn+1 are inputted. To one input terminal of the decoder 11, a signal line L11 through which a logical input signal is input is connected. Further, the output terminal of the decoder 11 is connected to the input terminal of the switching circuit 12. To one output terminal of the switching circuit 12, a signal line L12 is connected. When the device including this circuit is in the logical operation mode, a logical output signal is output from the signal line L12. Further, a plurality of other output terminals of the switching circuit 12 are connected in parallel with n+1 memories M1–Mn+1. To the input terminal of the memory Mn+1 is input a mode select signal MOD. Memories M1–Mi (i is an integer more than 1 and less than n) of the memories M1–Mn+1 are connected in parallel with the switching circuit 13. In addition, wiring formation signals G1–Gm are outputted from the switching circuit 13.

Only the wiring formation section of the fundamental section in the first embodiment is shown in FIG. 1(b). The signal line L11 is connected to the input terminal of the wiring formation section 14 and the signal line L12 is connected to the output terminal thereof. Further, the wiring formation section 14 is operative to switch the connecting state between signal lines L11 and L12 in response to wiring formation signals G1–Gm input thereto. One fundamental section is constituted by such elements respectively shown in FIGS. 1(a) and 1(b).

In the memory Mn+1 of the memories M1–Mn+1, data for selectively designating either of the logical operation mode and the wiring formation mode is written. Further, in the case of the logical operation mode, logic data are stored in other memories M1–Mn+1, respectively. In the case of the wiring formation mode, wiring formation data are stored in the memories M1–Mi, respectively.

First, a mode select signal is input to the memory Mn+1. In the case where data for selecting the wiring formation mode is written, a mode signal MOD of high level and a mode signal bar MOD of low level are output. In contrast, in the case where data for selecting the logical operation mode are written, a mode signal MOD of low level and a mode signal bar MOD of high level are outputted.

In the case of the wiring formation mode, the mode signal MOD of high level is input to the switching circuit 13, so all the switching elements therein become conductive. Thus, data stored in the memories M1–Mi are outputted as wiring formation signals G1–Gm, and are then delivered to the wiring formation section 14. At the wiring formation section 14, the connecting state between the signal line L11 and the signal line L12 is switched in dependency upon the wiring formation signals G1–Gm.

Further, the mode signal bar MOD of low level is delivered to the decoder 11, so the decoder 11 is placed in a non-operative state. Thus, the logical input signal is not input to the switching circuit 12. As a result, all the switching elements in the switching circuit 12 are kept in a non-conductive state. Thus, no logical output signal is output from the signal line L12.

In the logical operation mode, the mode signal MOD of low level is outputted from the memory Mn+1 as described above, and is then delivered to the switching circuit 13. As a result, the switching circuit 13 becomes non-conductive. Thus, outputting of wiring formation signals G1–Gm is not carried out from the memories M1–Mi.

On the other hand, the mode signal bar MOD of high level is delivered from the memory Mn+1 to the decoder 11, so the decoder 11 is brought into an operative state. As a result, the decoder 11 is supplied with a logical input signal to decode that signal input thereto to deliver its decoded result to the switching circuit 12. Thus, the switching circuit 12 selects any one of memories M1–Mn to switch the ON/OFF states of the switching elements therein so that the selected memory M and the signal line L12 are connected. As a result, data stored in the selected memory M is output from the signal line L12 to the external as a logical output signal.

As stated above, in accordance with this embodiment, in the case of the wiring formation mode, data is programmed so that a mode signal of high level and a mode signal bar MOD of low level are output from the memory Mn+1, and data required for wiring formation is programmed in the memories M1–Mi. In the case of the logical operation mode, data is programmed so that a mode signal of low level and a mode signal bar MOD of high level are outputted from the memory Mn+1, and data serving as a logical output signal are programmed in the memories M1–Mn. The device of this embodiment can therefore cope with any operation mode, and it is possible to freely select an arbitrary mode in correspondence with the specification of the device.

Figure 4:
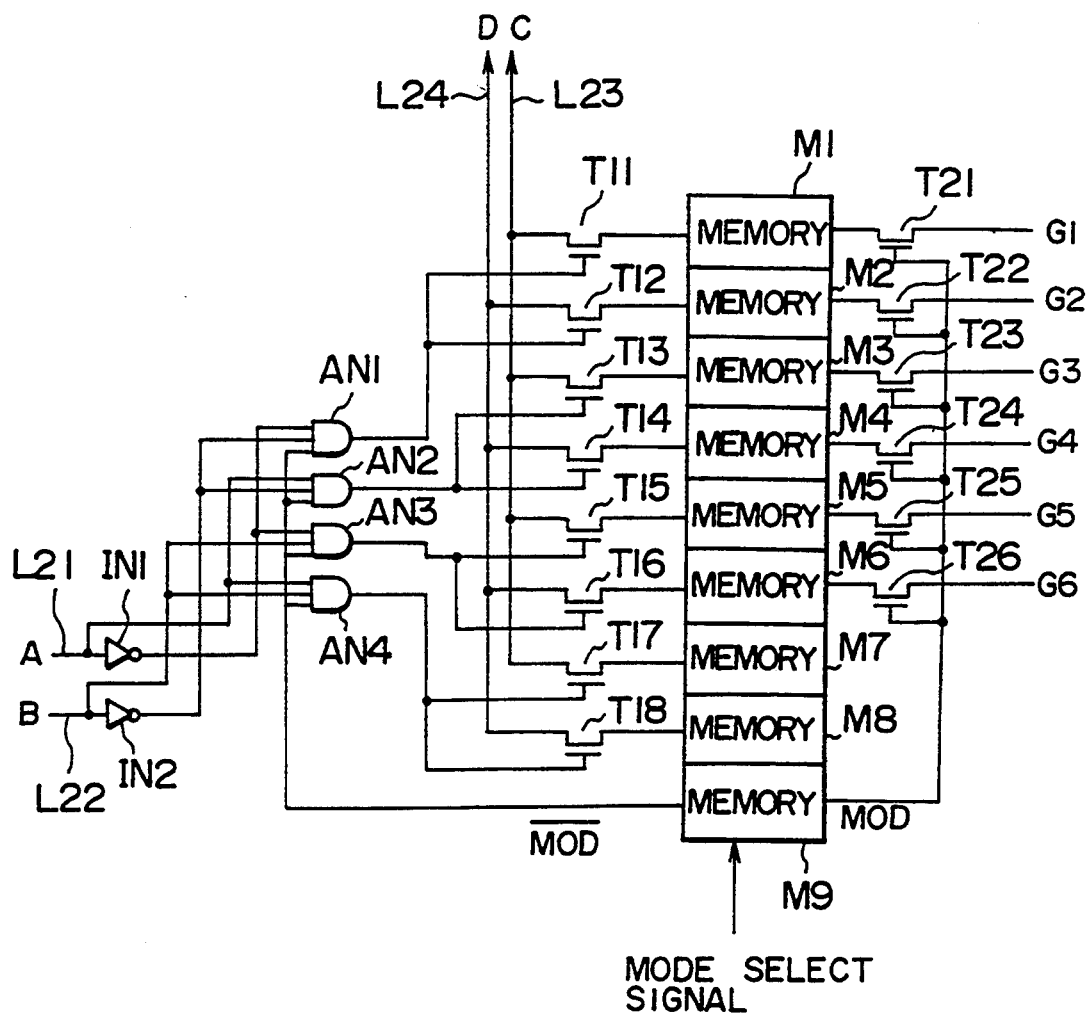
FIG. 4 is a circuit diagram showing the configuration of a fundamental section of a semiconductor integrated circuit according to a second embodiment of this invention.
Figure 5:
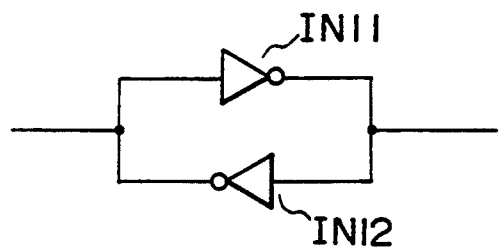
FIG. 5 is a circuit diagram showing an example of the configuration of a memory in the above-mentioned semiconductor integrated circuit.

An example of a circuit of a second embodiment having a more practical configuration is shown in FIGS. 4 and 5. In FIG. 4, the circuit of the second embodiment includes inverters IN1 and IN2, and AND circuits AN1–AN4 as the circuit component corresponding to the decoder 11 in the first embodiment. Further, this circuit includes N-channel MOS-type transistors T11–T18 as the switching circuit 12, and includes nine memories M1–M9 as the memory. In this case, any elements capable of storing data of at least one bit may be employed as the memories M1–M9. For example, a latch circuit constituted with two inverters IN11 and IN12 as shown in FIG. 5 may be employed. In addition, this circuit includes transistors T21-T26 as the switching circuit 13.

Figure 6:
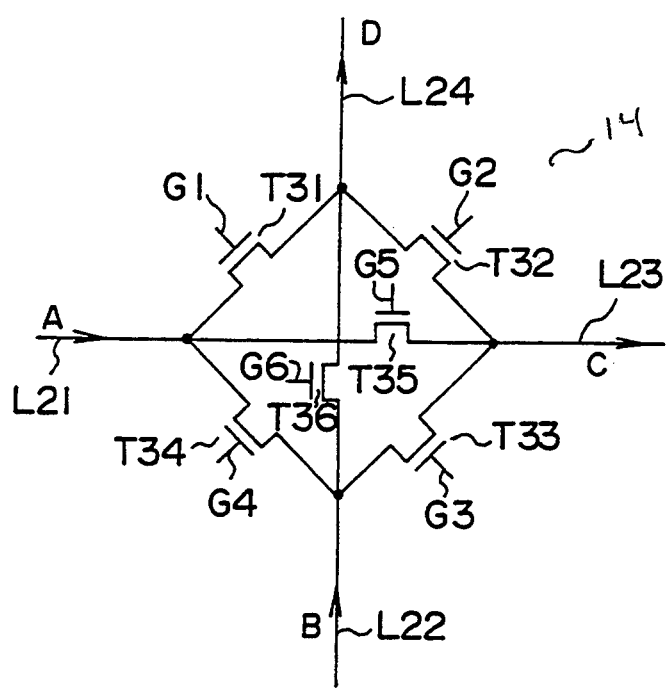
FIG. 6 is a circuit diagram showing the configuration of a wiring formation section in the above-mentioned semiconductor integrated circuit.

A wiring formation section 14 in this embodiment is shown in FIG. 6. This wiring formation section 14 includes transistors T31-T36 in order to switch the connecting states of signal lines L21-L24. The drain/source of the transistor 35 are connected between the signal lines L21 and L23, and the drain/source of the transistor T36 are connected between the signal lines L22 and L24. Further, the drain/source of the transistor T31 are connected between the signal lines L21 and L24, and the drain/source of the transistor T34 are connected between the signal lines L21 and L22. The drain/source of the transistor T33 are connected between the signal lines L22 and L23. The drain/source of the transistor 32 are connected between the signal lines L23 and L24. In addition, wiring formation signals G1-G6 are input to the gates of the transistors T31-T36, respectively.

A mode select signal is inputted to the memory M9, so a mode signal MOD and a mode signal bar MOD are outputted in dependency upon data stored in the memory M9. In the case of the wiring formation mode, a mode signal MOD of high level is outputted from the memory M9, and is then input to all the gates of the transistors T21-T26. As a result, these transistors are turned ON. In this case, data necessary for wiring formation are stored in the memories M1-M6, and are output as wiring formation signals G1-G6, respectively.

These wiring formation signals G1-G6 are input to the gates of the transistors T31-T36, so these transistors are turned ON or OFF. Thus, connecting states between respective signal lines L21-L24 are determined. Moreover, a mode select signal bar MOD of low level is input to the AND circuits AN1-AN4, and signals of low level are input to the gates of all the transistors T11-T18. Thus, the transistors T11-T18 are all turned OFF. As a result, data stored in the memories M1-M8 are not outputted to the external.

In the case the logical operation mode, a mode signal MOD of low level is output from the memory M9, and is then input to the gates of the transistors T21-T26. As a result, these transistors are turned OFF. Thus, data stored in the memories M1-M6 are not outputted as wiring formation signals G1-G6. As a result, the transistors T31-T36 are all kept in an OFF state, leading to the state where signal lines L21-L24 are not connected to each other.

Further, a mode select signal bar MOD of high level is output from the memory M9, and is then input to the AND circuits AN1-AN4. From these AND circuits AN1-AN4, signals corresponding to the levels of logical input signals A and B are output. These output signals are input to the transistors T11-T18, respectively. Any one of transistors T11, T13, T15, T17 is turned ON by the logical input signals A and B. Further, any one of transistors T12, T14, T16, T18 is turned ON by the logical input signals A and B. For example, in the case where a signal of high level is output only from the AND circuit AN1 and a signal of low level is output from the other AND circuit AN4, only the transistors T11 and T12 are turned ON. Thus, the memories M1 and M2 and the signal lines L23 and L24 are connected. As a result, data stored in the memories M1 and M2 are output to external as logical output signals C and D, respectively. Thus, two memories are selected from the memories M1-M8 in dependency upon the levels of the logical input signals A and B. Thus, data of the selected memories are outputted to the external.

As stated above, in accordance with the second embodiment, a scheme is employed such that data of 9 bits is programmed per each fundamental section, thereby making it possible to set connecting states between all the signal lines L21-L24, and/or to perform a logical operation to output logical output signals C and D in response to respective logical input signals A and B.

Figure 7:
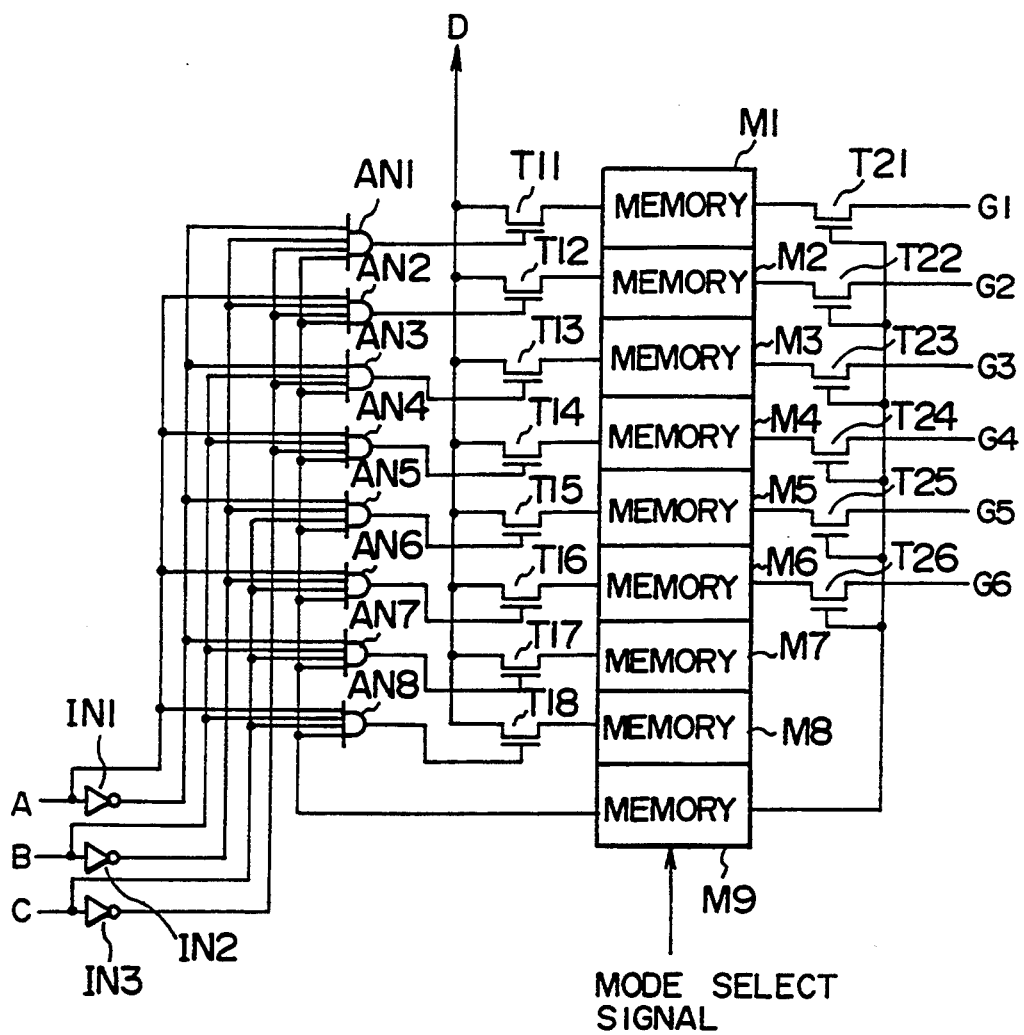
FIG. 7 is a circuit diagram showing the configuration of a fundamental section of a semiconductor integrated circuit according to a third embodiment of this invention.

The configuration of the fundamental section according to a third embodiment of this invention is shown in FIG. 7. In the above-described second embodiment, a scheme was employed such that two logical input signals A and B are input from the external when the device is in the logical operation mode, thus to output two logical output signals C and D. On the contrary, the third embodiments differs from the above-mentioned second embodiment in that a scheme is employed such that three logical input signals A, B and C are inputted to output a single logical output signal D. Accompanied by this, as the element corresponding to the decoder 11, the circuit of this embodiment includes three inverters IN1-IN3, and eight AND circuits AN1-AN8. When the device is in the logical operation mode, one of memories M1-M8 is selected in dependency upon the levels of three logical input signals A, B and C, so data stored in the selected memory is output to the external as a logical output signal D. Since other components and the operation when the device is in the wiring formation mode are similar to those in the case of the second embodiment, their explanation is omitted here.

As stated above, in accordance with the third embodiment, by programming data of 9 bits per each fundamental section, it is possible to set connecting states between signal lines L21-L24, and/or to perform a logical operation to output a logical output signal D in response to logical input signals A, B and C inputted thereto.

Figure 8:
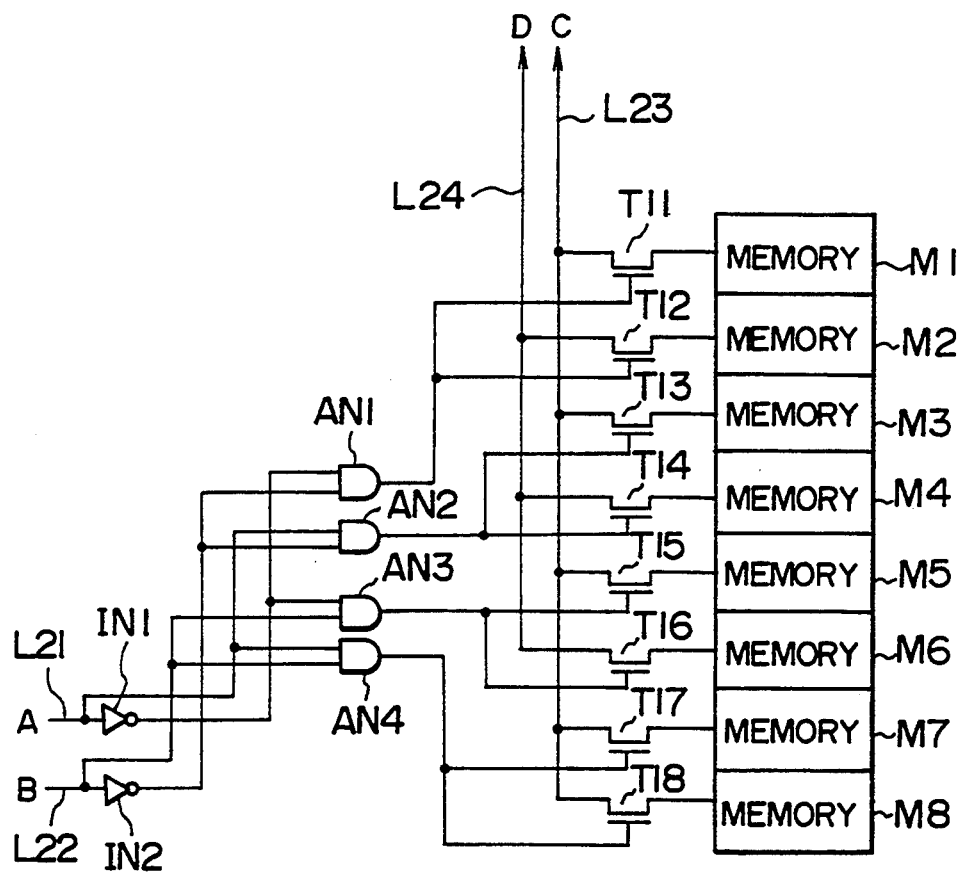
FIG. 8 is a circuit diagram showing the configuration of a fundamental section of a semiconductor integrated circuit according to a fourth embodiment of this invention.

A device provided with a fundamental section for carrying out only the logical operation will now be described as a fourth embodiment of this invention. In the above-described first, second and third embodiments, there is employed a configuration such that the section for carrying out formation of wirings is separate from the fundamental section for carrying out the logical operation. On the contrary, the fourth embodiment is characterized in that a fundamental section for carrying out only the operation in the logical operation mode as shown in FIG. 8 is arranged.

As compared to the second embodiment shown in FIGS. 4 and 6, transistors T21-T26, and T31-T36 are not provided. Further, a memory M9 for carrying out designation of mode is unnecessary, and a memory for storing data is comprised of memories M1-M8. In addition, inverters IN1-IN2, and AND circuits AN1-AN4 are provided as the decoder, and the connecting relationship is similar to that of the second embodiment except for wiring with respect to the memory M9.

When the device is in the logical operation mode, logical input signals A and B are input. As a result, a signal of high level is outputted from any one of AND circuits AN1-AN4. Thus, any one of sets of memories M1 and M2, M3 and M4, M5 and M6, and M7 and M8 are selected. Data stored in the selected set of memories are output through signal lines L23 and L24 as logical output signals C and D.

In the fourth embodiment, the number of transistors can be reduced, thus to realize a simple configuration.

However, it should be noted that the logical operation mode must be used as a substitute for switching of wiring connection, so the direction in which a signal flows from signal lines L21 and L22 to the signal lines L23 and L24 is univocally determined, resulting lowered degree of freedom of wiring.

Figure 9A:
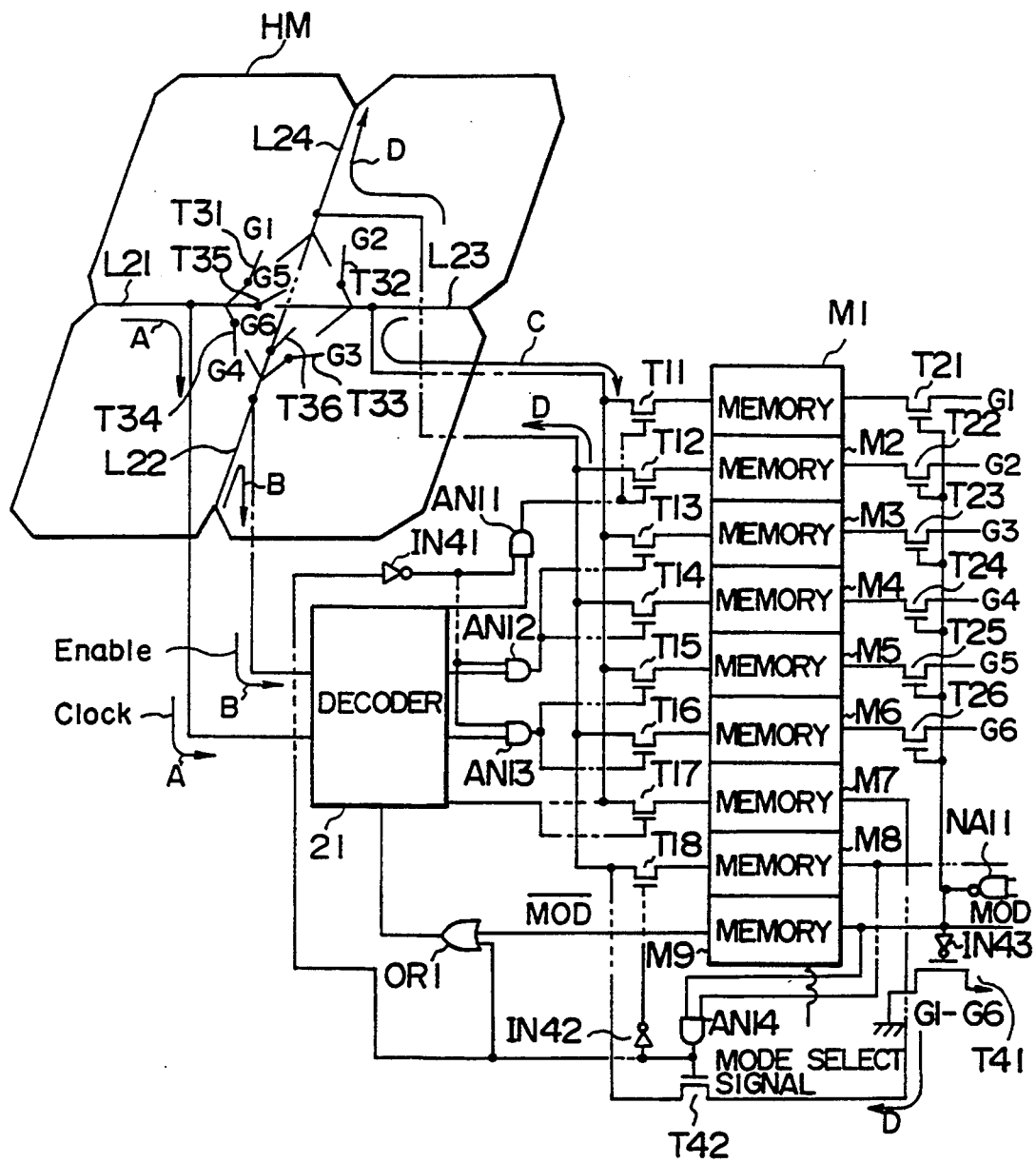
FIG. 9(A), 9(B) and 9(C) are used to explain the configuration of a fundamental section of a semiconductor integrated circuit according to a fifth embodiment of this invention, the relationship between designation of mode and the output level of the memory, and an image of the memory.

In the above-described first to fourth embodiments, logic circuits formed when the device is in the logical operation mode are all directed to combinational logic circuits in principle. On the contrary, a fifth embodiment of this invention which will be described below is characterized in that when the device is in the logical operation mode, not only a combinational logic circuit but also a sequential logic circuit can be formed. In this embodiment, a latch function is provided in the logic circuit, and its configuration is as shown in FIG. 9(a).

Figure 10:
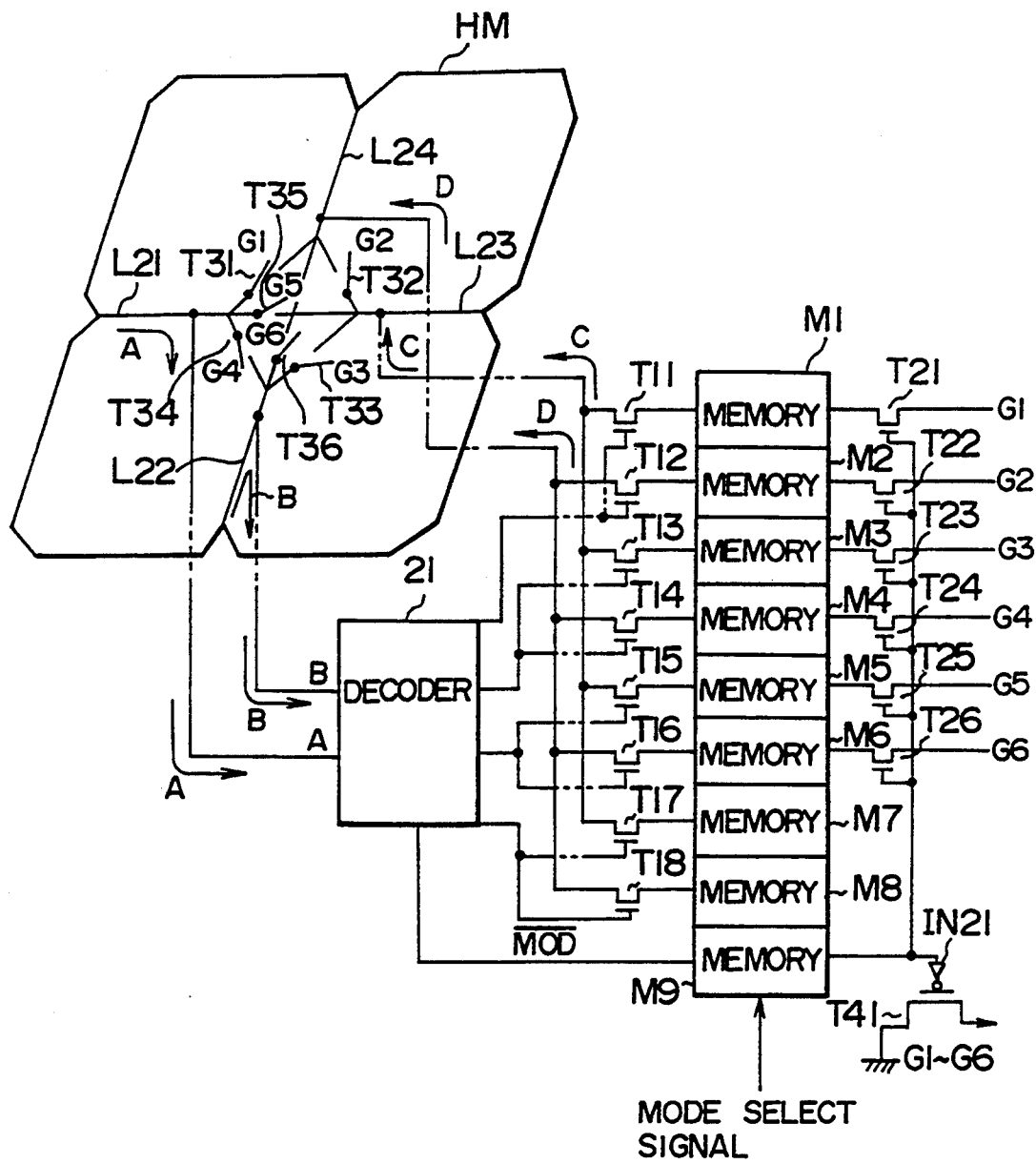
FIG. 10 is a circuit diagram showing the state when one fundamental section in the semiconductor integrated circuit according to the second embodiment of this invention is in a logical operation mode.

In explaining the fifth embodiment, the operation of the second embodiment shown in FIGS. 4 and 6 will be first described with reference to the figure including the wiring formation section. FIG. 10 shows a combinational circuit formed when the device is in the logical operation mode in the second embodiment. Respective components are the same as those shown in FIGS. 4 and 6. This device includes a physical wiring surface HM as the wiring formation section. As described above, transistors T31-T36 are provided as a switching element between the signal lines L21-L24. These signal lines L21 and L22 are connected to the input terminals of the decoder 21. This decoder 21 corresponds to a decoder constituted with inverters IN1 and IN2, and AND circuits AN1-AN4 in FIG. 4. Further, the input terminal of the inverter IN21 is connected to the output terminal of the memory M9 and all the gates of transistors T21-T26, and the gate of a transistor T41 of which source is grounded is connected to the output terminal of the inverter IN21. The reason why this circuit configuration is employed is to prevent the gate potentials of the transistors T21-T26 being brought into a floating state in the case where a mode signal MOD output from the memory M9 is at low level. Therefore, such circuit configuration is not necessarily required.

When the device is in the logical operation mode, a mode signal MOD of low level and a mode signal bar MOD of high level are outputted from the memory M9 as described above. The mode signal MOD of low level is input to each of gates of the transistors T21-T26. As a result, these transistors are turned OFF, and wiring formation signals G1-G6 are all placed in the state where they are at low level. Thus, the transistors T31-T36 are turned OFF, and so connections between respective signal lines L21-L24 are opened.

By signal lines L21 and L22 on the physical wiring surface HM, logical input signals A and B are input to the decoder 21. At this time, this decoder is in an operative state because a mode signal bar MOD of high level is input thereto. The logical input signals A and B are decoded by the decoder 21, and two transistors of transistors T11-T18 are turned ON. Thus, data are output from memories connected to those transistors onto the physical wiring surface HM as logical output signals C and D.

Figure 11:
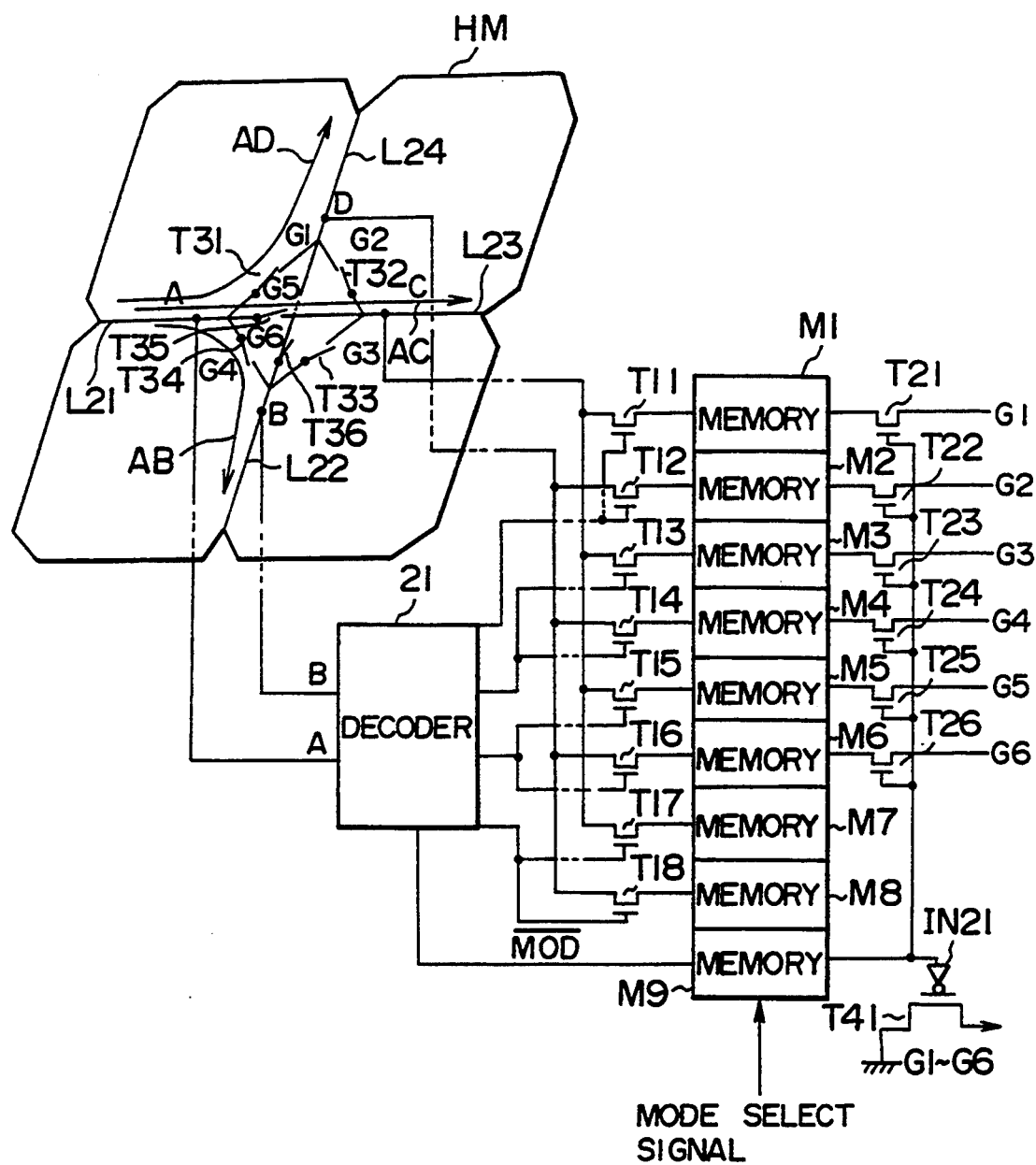
FIG. 11 is a circuit diagram showing the state when one fundamental section in the semiconductor integrated circuit according to the second embodiment of this invention is in a wiring formation mode.

When the device is in the wiring formation mode, a mode signal MOD of high level and a mode signal bar MOD of low level are outputted from the memory M9 as shown in FIG. 11.

The mode signal MOD of high level is input to each of the gates of the transistors T21-T26, so these transistors are all turned ON. As a result, data stored in the memories M1-M6 are output as wiring formation signals G1-G6. On the physical wiring surface HM, ON/OFF states of the transistors T31-T36 are switched in dependency upon these wiring formation signals G1-G6. Thus, connecting states of signal lines L21-L24 are set.

On the other hand, since the mode signal bar MOD of low level is input to the decoder 21, this decoder becomes non-operative. Thus, data stored in the memories M1-M8 are not output to the physical wiring surface HM as logical output signals C, D.

Figure 9B:
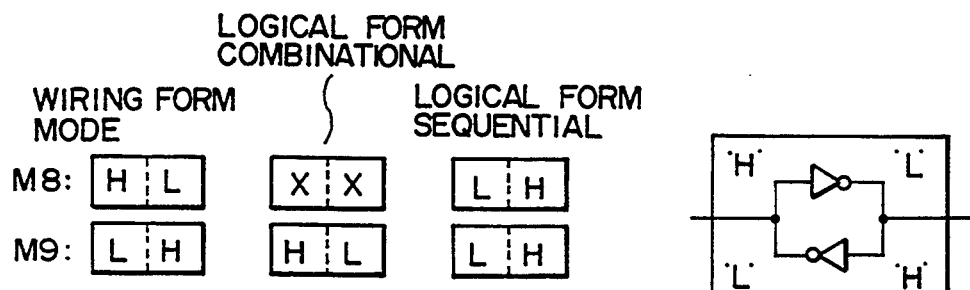
Figure 9C:
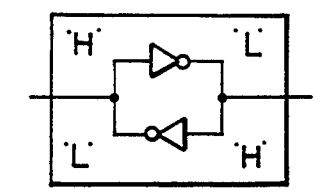

The circuit of the fifth embodiment shown in FIG. 9(a) includes, in addition to the components of the second embodiment of FIG. 10 or 11, inverters IN41 and IN42, AND circuits AN11-AN14, a NAND circuit NA11, an inverter IN43, an OR circuit OR1, and a transistor T42. Thus, the circuit of the fifth embodiment can also realize the sequential logical operation mode in addition to the wiring formation mode and the combinational logical operation mode. Designation of this mode is carried out by an output signal or signals from memory M8 or memories M8 and M9. Output levels of the memories M8 and M9 when three modes are designated are shown in FIG. 9(b). It is now assumed that reference symbol "X" indicates that the level is irrelevant. An image of each memory is as shown in FIG. 9(c). When the device is in the wiring formation mode, a mode signal MOD of high level (a mode signal bar MOD of low level) is output from the memory 9, and a signal of high level is output from the memory 8 to the transistor T18. When the device is in the combination logical operation mode, a mode signal MOD of low level (a mode signal bar MOD of high level) is output from the memory M9. When the device is in the sequential logical operation mode, a mode signal MOD of high level (a mode signal bar MOD of low level) is output from the memory M9, and a signal of low level is output from the memory M8 to the transistor T18.

When the device is in the wiring formation mode, the transistors T21-T26 are all turned ON by the mode signal MOD of high level which is output from the memory M9. Thus, wiring formation signals G1-G6 are outputted from the memories M1-M6, respectively.

Further, the mode signal MOD of high level output from the memory M9 and the signal of low level output from the memory M8 are input to the AND circuit AN14, so a signal of low level is output therefrom. The signal of low level and the mode signal bar MOD of low level are input to the OR circuit OR1. As a result, an output of low level is delivered to the decoder 21. Thus, the decoder 21 is brought into a non-operative state. As a result, data stored in the memories M1-M8 are not output to the wiring surface HM.

When the device is in the combinational logical operation mode, a mode signal MOD of low level and a mode signal bar MOD of high level are output from the memory M9 similar to the case of other embodiments. The mode signal MOD of low level output from the memory M9 is input to the AND circuit AN14, and is further input to the OR circuit OR1 and the inverter IN42. Since a signal of high level inverted by the inverter IN42 is input to the gate of the transistor T18, this transistor T18 is turned ON. Further, a mode signal bar MOD of high level is input from the memory M9 to the OR circuit OR1 as the other input. As a result, a signal of high level is output and is delivered to the decoder 21. Thus, the decoder 21 is brought into an operative state. The signal of low level output from the AND circuit AN14 is inverted by inverter IN41. The signal thus obtained is input to each of the AND circuits AN11–AN13. When logical input signals A and B are input to the decoder 21, outputs based on the levels of these signals are given to the AND circuits AN11–AN13. As a result, any one of sets of transistors T11 and T12, T13 and T14, T15 and T16, and T17 and T18 are turned ON. Thus, data in any one of sets of memories M1 and M2, M3 and M4, M5 and M6, and M7 and M8 connected to the set of transistors which have been turned ON are outputted to the physical wiring surface HM as logical output signals C and D. In addition, since the mode signal MOD of low level outputted from the memory M9 is input to the gates of the transistors T21–T26, these transistors are in an OFF state. For this reason, wiring formation signals G1–G6 are not output.

When the device is in the sequential logical operation mode, a mode signal bar MOD of low level is outputted from the memory 9 to the OR circuit OR1, and a signal of low level is output from the memory M8 to the transistor T18. At the same time, a mode signal MOD of high level is output from the memory M9, and a signal of high level is output from the memory M8. Respective signals are given to the AND circuit AN14. Thus, a signal of high level is output from the AND circuit AN14, and this signal of high level and the mode signal bar MOD of low level from the memory M9 are input to the OR circuit OR1. As a result, a signal of high level is input from the OR circuit OR1 to the decoder 21. Thus, the decoder 21 is brought into an operative state.

Further, a signal of low level obtained by inverting the signal of high level from the AND circuit AN14 by using the inverter IN42 is inputted to the gate of the transistor T18. As a result, this transistor T18 is turned OFF. The signal of high level from the AND circuit AN14 is further inverted by the inverter IN41 to give a signal of low level. This signal of low level is inputted to the AND circuit AN11, thus allowing transistors T11 and T12 to be turned OFF. At the same time, the signal of low level outputted from the inverter IN41 is also input to the AND circuits AN12 and AN13, thus allowing transistors T13–T16 to be all turned OFF. Thus, of transistors T11–T16 and T18 all except for the transistor T17 are turned OFF. In this sequential logical operation mode, a memory M7 connected to the transistor T17 is used in order to latch the logical input signal C.

Logical input signals A and B are input from the signal lines L21 and L22 on the physical wiring surface HM to the decoder 21 in an operative state. The state when the logical input signal B is at high level corresponds to the enable state, and a latch operation is carried out at the timing where the logical input signal A rises up to high level. When an output signal of high level is input from the decoder 21 to the gate of the transistor T17, this transistor T17 is turned ON. A logical input signal C is input from the signal line L23 on the physical wiring surface HM to the memory M7 through the transistor T17, and is latched thereat. A logical output signal D is output from the memory M7, and is then outputted to the signal line L24 on the physical wiring surface HM through the transistor T42 placed in an ON state.

Figure 12:
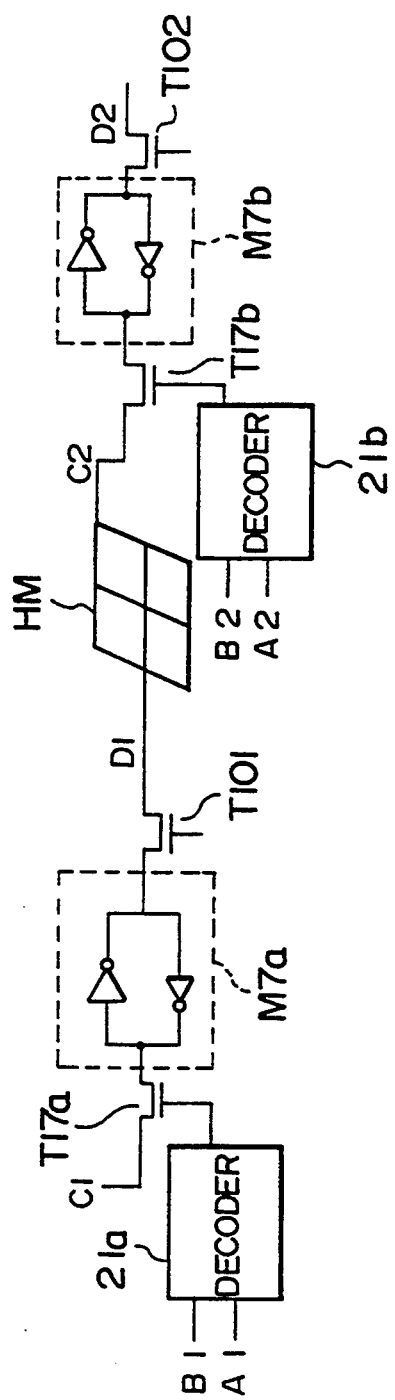
FIG. 12 is a circuit diagram showing the configuration of a flip-flop of the master-slave type using two fundamental sections of the semiconductor integrated circuit according to the fifth embodiment of this invention.

An approach may be employed such that two fundamental sections according to the fifth embodiment for performing such a sequential logical operation are prepared, thus to constitute a flip-flop of the master-slave type. The configuration of the flip-flop of the master slave type is shown in FIG. 12. On the master side, there are provided a decoder 21a adapted so that logical input signals A1 and B1 are inputted thereto, a transistor T17a adapted so that an output from the decoder 21a is inputted to its gate, and a memory M7a for latch operation. These circuit components are connected to the physical wiring surface HM through a transistor T101. This flip-flop is brought into an enable state when the logical input signal B1 is at high level. When the logical input signal A1 rises up to high level, the transistor T17a is turned ON. As a result, the logical input signal C1 is input to the memory M7a, and is latched therein. Thus, a logical output signal D1 is output from the memory M7a, and is then delivered to the physical wiring surface HM through the transistor T101.

On the slave side, there are provided in a similar fashion to the master side, a decoder 21b adapted so that logical input signals A2 and B2 are input thereto, a transistor T17b adapted so that an output from the decoder 21b is input to its gate, and a memory M7b for latch operation. Similarly to the master side, when the logical input signal B2 is at high level and the logical input signal A2 rises up to high level, the logical input signal C2 delivered from the physical wiring surface HM is latched in the memory M7b. Thus, a logical output signal is output from the memory M7b.

The operation in the case of writing data into the memory of the semiconductor integrated circuit according to this invention and the operation in the case of carrying out a test in connection with the memory, the physical wiring surface and the decoder of the semiconductor integrated circuit will now be described. Explanation will now be given by taking an example of the case where data is written into a device provided with a plurality of semiconductor integrated circuits according to the second embodiment shown in FIGS. 10 and 11 described above, and the case where a test is conducted.

Figure 13:
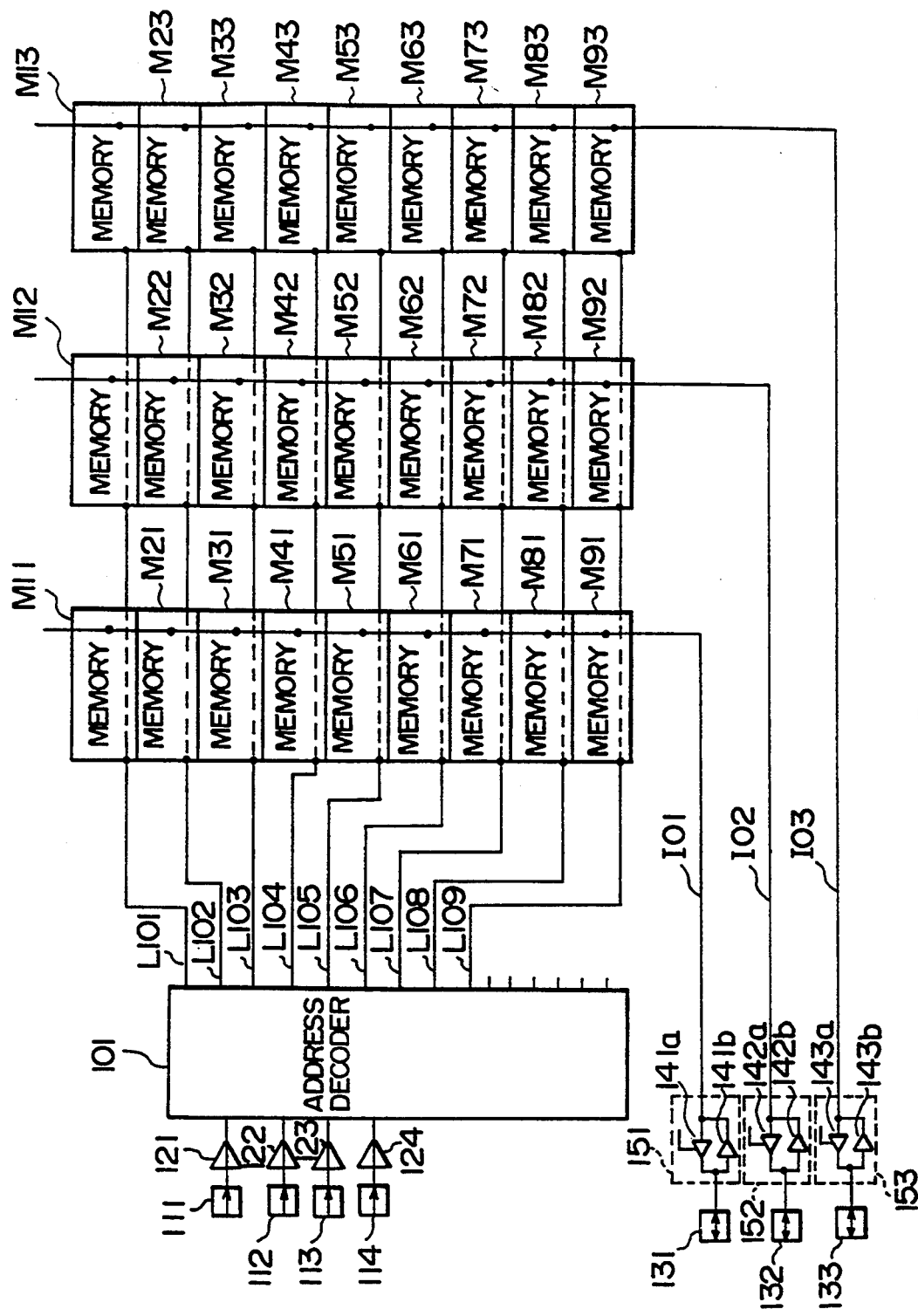
FIG. 13 is a block diagram showing the configuration in the case where a test is implemented to a device including a plurality of semiconductor integrated circuits according to the second embodiment of this invention.

FIG. 13 shows three sets of memories (memories M11–M91, memories M12–M92, and memories M13–M93) that three semiconductor integrated circuits have by nine memories.

To memories M11–M93 of three circuits arranged in an array form of 9×3 in this way, nine signal lines L101–L109 connected to the output terminals of an address decoder 101 and three signal lines I01–I03 connected to the output terminals of data input/output buffers 151–153 are connected in a row direction and in a column direction, respectively.

To the input terminal side of the address decoder 101, address input terminals 111–114 to which address signals for designating addresses in a row direction are inputted are respectively connected through input buffers 121–124.

The data input/output buffers 151–153 respectively include a tristate buffer 141a and a buffer 141b, a tristate buffer 142a and a buffer 142b, and a tristate buffer 143a and a buffer 143b, and their input sides are connected to data input/output terminals 131–133 to which data signals are inputted.

Figure 14:
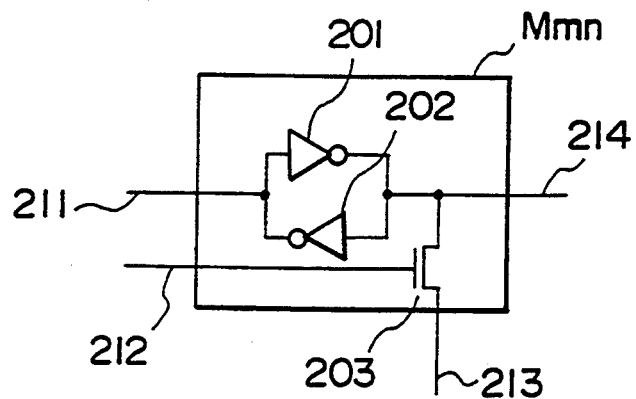
FIG. 14 is a circuit diagram showing the configuration of a memory of the device shown in FIG. 13.

Moreover, the memories M11–M93 have a configuration as shown in FIG. 14. As a fundamental configuration, this circuit includes a latch circuit comprised of two inverters 201 and 202 similarly to the circuit shown in FIG. 5. An input terminal 211 of this latch circuit is connected to one end of transistors T11–T18 in FIGS. 10 and 11, and an output terminal 214 is connected to one ends of transistors T21–T26, or the input terminal of the inverter IN21.

In addition to the above-mentioned latch circuit, this circuit includes an N-channel transistor 203. One terminal of the transistor 203 is connected to the output terminal 214, and a gate terminal 212 is connected to each output terminal of the address decoder 101 by means of signal lines L101–L109. Further, the other terminal 213 of the transistor 203 is connected to signal lines I01–I03.

Writing data into memories M11–M93 is performed as follows. Address signals for selecting at least any one of nine rows are inputted to address input terminals 111–114. These address signals are input to the address decoder 101, at which they are decoded. Signals indicating the decoded results are outputted from signal lines L101–L109. The signals thus obtained are inputted to the gates of transistors 203 of at least three memories M arranged in a selected row. As a result, these transistors become conductive.

Then, data to be respectively stored into the selected memories M are input from the data input/output terminals 131–133. These data are delivered to the selected memories M via data input/output buffers 151–153. In this case, since the tristate buffers 141a–143a of respective data input/output buffers 151–153 are all in high impedance state, data are outputted to the signal lines I01–I03 via buffers 141b–143b. Data which is input to the selected memories M via signal lines I01–I03 are held at latch circuits each comprised of inverters 201 and 202 through the transistors 203 which are in a conductive state. Data showing either of the logical operation mode and the wiring formation mode are inputted to memories M91–M93 of the final row as described above, and are held therein.

The case where test of the device is conducted will now be described. In the case of writing test data into the memories M11–M93, such write operation can be carried out similarly to the above-mentioned case where data for ordinarily operating the device is written.

In the case of reading out the written test data from the memories M11–M93, the following operation will be conducted. Transistors 203 of memories Mmn to be read out are selected every row to allow those transistors to be conductive by using address signals. Data latched at three memories Mmn of the selected row are read out to signal lines I01–I03 through the transistors 203, and are then delivered to data input/output buffers 151–153. In this case, data are outputted from the data input/output terminals 131–133 to the external through tristate buffers 141a–143a in low impedance state. By examining the outputted results, whether or not the latch operations of memories M11–M93 are normal is confirmed.

Figure 15:
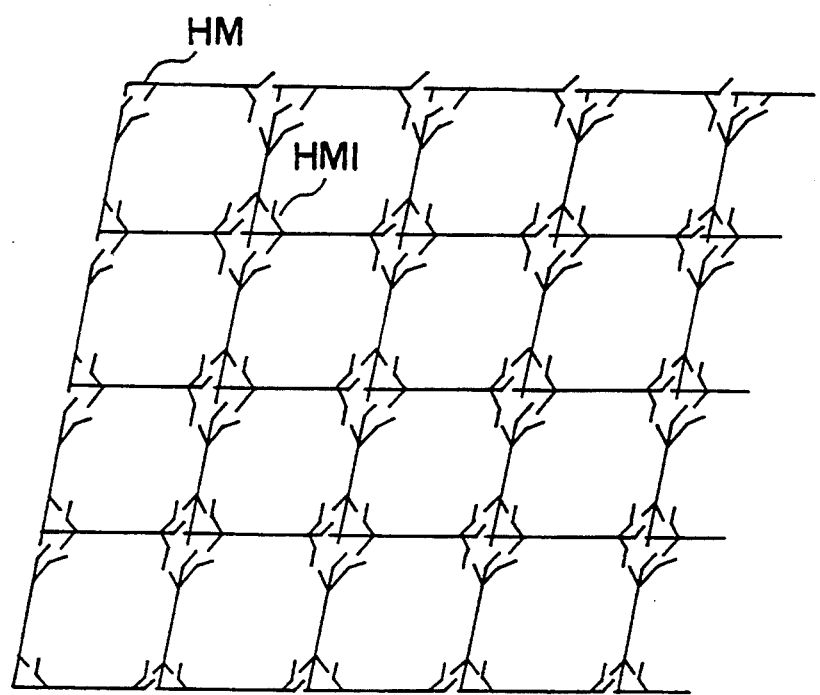
FIG. 15 is a circuit diagram showing the state where a plurality of physical wiring surfaces are disposed.
Figure 16:
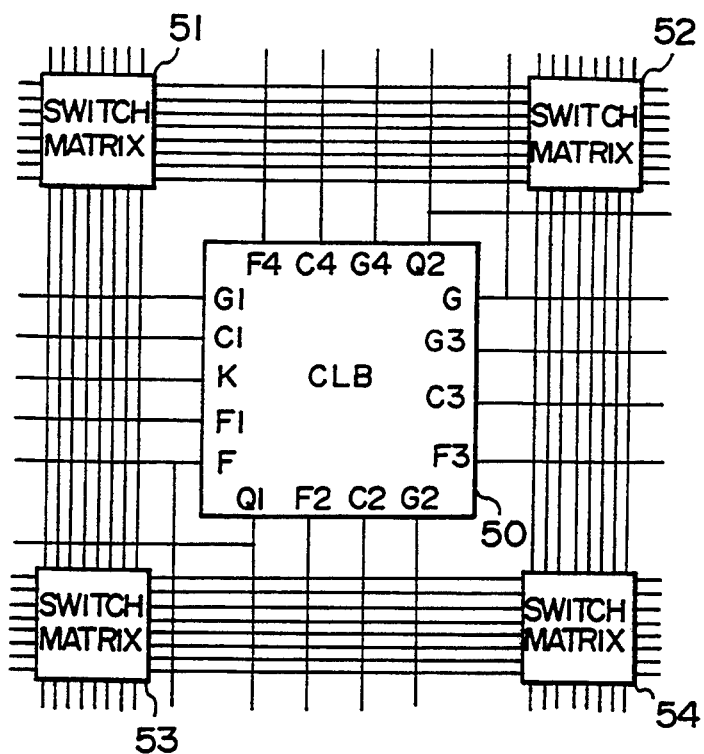
FIGS. 16 to 18 are circuit diagrams showing the configurations of several examples of conventional semiconductor integrated circuits, respectively.
Figure 17:
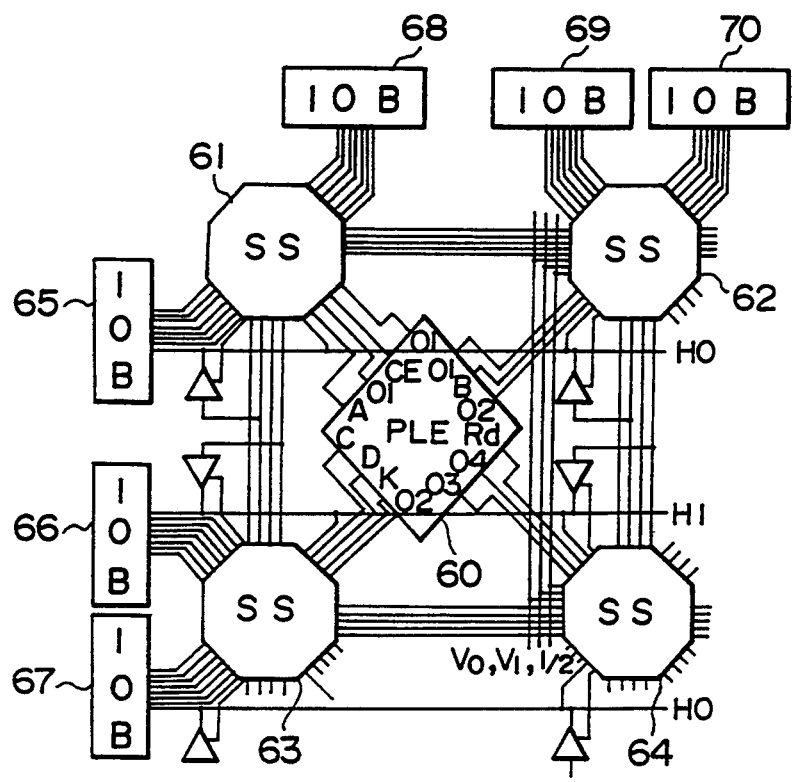
Figure 18:
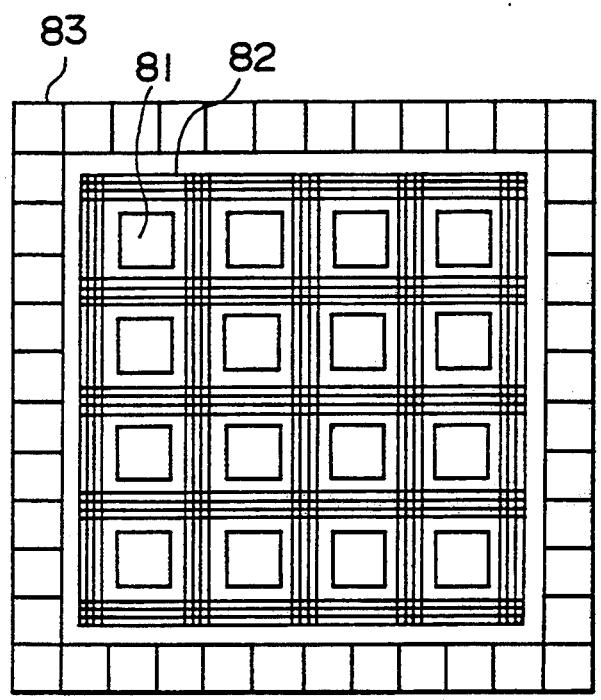
Figure 19:
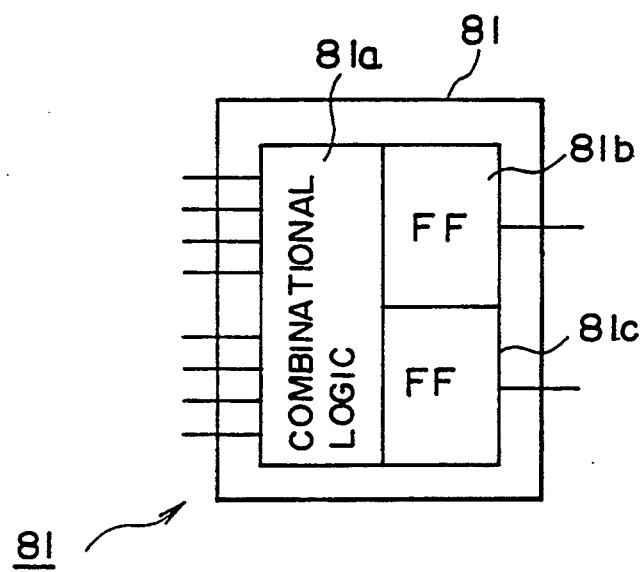
FIG. 19 is a circuit diagram showing a portion of the above-mentioned semiconductor integrated circuit shown in FIG. 18.
Figure 20A:
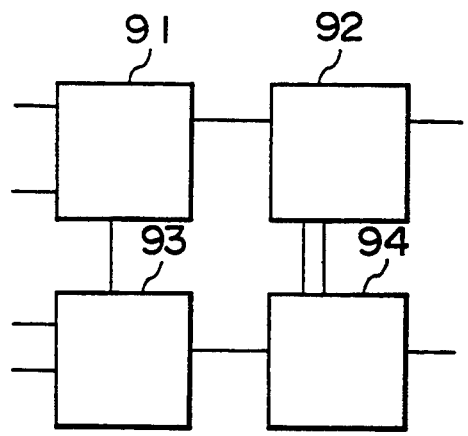
FIG. 20(A) and 20(B) are explanatory views regarding area efficiency in the case where different numbers of wirings are provided in the conventional semiconductor integrated circuit.
Figure 20B:
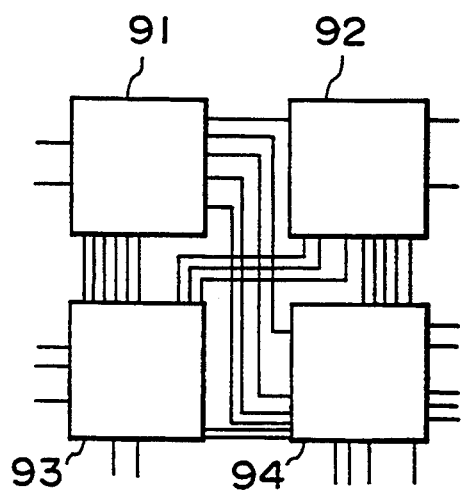

Testing whether the transistors T31–T36 on the physical wiring surface HM are in an open state or in a closed state can be conducted as follows. FIG. 15 shows the state where physical wiring surfaces HM that a plurality of semiconductor integrated circuits respectively have are arranged in a matrix form. Any one of physical wiring surfaces HM1 of these physical wiring surfaces HM is caused to be in a logical operation mode to output test data onto this physical wiring surface HM1. Then, physical wiring surfaces HM existing between the physical wiring surface HM1 and external terminals (not shown) are caused to be in a wiring formation mode to allow respective transistors T31–T36 to be opened or closed so that a desired path is formed. By examining whether or not data output from the physical wiring surface HM1 is normally outputted from the external terminals via this path, it is possible to examine whether or not the physical wiring surfaces HM constituting this path is normal.

The test of the decoder 21 shown in FIG. 10 can be conducted, e.g., by a method of inputting test signals A and B from the physical wiring surface HM to the decoder 21 to examine data outputted from the decoder 21, or the like.

It should be noted that the above-described embodiments are all presented only for illustrative purpose, and do not limit this invention by any means. For example, the fundamental section may be of any structure operable in a mode arbitrarily selected from the logical operation mode and the wiring formation mode. In addition, it is not necessarily required that both the combinational logical operation and the sequential logical operation be realized as the logical operation mode.

What is claimed is:

1. A semiconductor integrated circuit having a plurality of fundamental sections connected to a plurality of signal lines, wherein said fundamental sections are permitted to carry out both a first operation in a logical operation mode for performing sequential logical operations by using signals delivered from said signal lines and a second operation in a wire formation mode for the setting of connections between the respective signal lines, each of said fundamental sections being selectively operable in either operation mode;

wherein each said fundamental section comprises:

a mode designator adapted to output a mode signal for designating either of said logical operation mode and said wiring formation mode;

a memory section including a plurality of memories for storing data;

a decoder adapted to be brought into an operative state when the mode signal outputted from said mode designator corresponds to said logical operation mode to decode a logical input signal given thereto and to output a switching signal;

a first switching circuit including a plurality of first switching elements connected to said memories of said memory section, said first switching circuit being responsive to the switching signal given thereto to switch ON/OFF states of said first switching elements, to allow the memory or memories connected to any of the first switching elements which have been turned ON to output data stored therein as a logical output signal;

a second switching circuit including a plurality of second switching elements connected to said memories of said memory section, said second switching circuit being operative to allow said second switching elements to be turned ON when the mode signal outputted from said mode designator corresponds to said wiring formation mode to allow the memory or memories connected to the second switching elements which have been turned ON to output data stored therein as a wiring formation signal; and a third switching circuit including a plurality of third switching elements connected between said signal lines, said third switching circuit being responsive to the wiring formation signal outputted from said second switching circuit, switching the ON/OFF states of said third switching elements in response to the wiring formation signal.

2. A semiconductor integrated circuit as set forth in claim 1,
wherein at least one of said memories of said memory section corresponds to a latch memory;
said decoder being operative to allow the first switching element connected to said memory for the latching of said first switching elements to be turned ON when the inputted logical input signal is at a predetermined level to deliver to said latch memory data delivered from said signal lines to allow said latch memory to latch the data.

* * * * *